(12) United States Patent
Wu et al.

(10) Patent No.: US 12,740,191 B2
(45) Date of Patent: Sep. 15, 2026

(54) LIGHT EMITTING DEVICE HAVING ONE CURRENT LIMITING LAYER WITH HIGHER ALUMINUM CONTENT THAN ANOTHER CURRENT LIMITING LAYER

(71) Applicant: AUO Corporation, Hsinchu (TW)

(72) Inventors: Chao-Hsin Wu, Taipei (TW); Chee Keong Yee, Taipei (TW); Jia Ming Lin, Taipei (TW); Chia-An Lee, Hsinchu (TW); Kuan-Heng Lin, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 441 days.

(21) Appl. No.: 18/466,841

(22) Filed: Sep. 14, 2023

(65) Prior Publication Data

US 2024/0372034 A1 Nov. 7, 2024

(30) Foreign Application Priority Data

May 3, 2023 (TW) ................................ 112116396

(51) Int. Cl.

| | |
|---|---|
| ***H10H 20/816*** | (2025.01) |
| ***H10H 20/80*** | (2025.01) |
| ***H10H 20/824*** | (2025.01) |
| ***H10H 20/841*** | (2025.01) |

(52) U.S. Cl.
CPC ...... *H10H 20/8162* (2025.01); *H10H 20/816* (2025.01); *H10H 20/824* (2025.01); *H10H 20/841* (2025.01); *H10H 20/862* (2025.01)

(58) Field of Classification Search
CPC ............. H10H 20/8162; H10H 20/824; H10H 20/816; H10H 20/862
See application file for complete search history.

(56) References Cited

U.S. PATENT DOCUMENTS

| | | | | |
|---|---|---|---|---|
| 9,484,492 | B2 | 11/2016 | Bour et al. | |
| 10,418,519 | B2 | 9/2019 | Bour et al. | |
| 10,516,250 | B1 * | 12/2019 | Su ...................... | H01S 5/18377 |
| 10,923,626 | B2 | 2/2021 | Bour et al. | |

(Continued)

FOREIGN PATENT DOCUMENTS

| | | |
|---|---|---|
| CN | 107408603 | 4/2020 |
| CN | 106711301 | 10/2020 |

(Continued)

*Primary Examiner* — Eliseo Ramos Feliciano
*Assistant Examiner* — Brad A Knudson
(74) *Attorney, Agent, or Firm* — JCIPRNET

(57) ABSTRACT

A light emitting device including an active layer, a first semiconductor layer, a first contact layer, and a first current limiting layer is provided. The first semiconductor layer is disposed at a first side of the active layer. The first contact layer is disposed at a side of the first semiconductor layer away from the active layer. The first current limiting layer is disposed between the first contact layer and the active layer, and is provided with a first non-oxidizing region and a first oxidizing region located around the first non-oxidizing region. The first current limiting layer has a first surface facing the active layer and a second surface away from the first surface. The first oxidizing region is extended from the first surface to the second surface, and an oxygen content of the first oxidizing region is greater than an oxygen content of the first non-oxidizing region.

16 Claims, 9 Drawing Sheets

(56) References Cited

U.S. PATENT DOCUMENTS

| | | | | |
|---|---|---|---|---|
| 11,296,254 | B2 | 4/2022 | Lin et al. | |
| 11,424,289 | B2 | 8/2022 | Tyagi et al. | |
| 2005/0139856 | A1* | 6/2005 | Hino | H01S 5/2231 257/101 |
| 2016/0197232 | A1 | 7/2016 | Bour et al. | |
| 2018/0374991 | A1 | 12/2018 | Bour et al. | |
| 2020/0052158 | A1 | 2/2020 | Bour et al. | |
| 2021/0057607 | A1 | 2/2021 | Lin et al. | |
| 2021/0151498 | A1 | 5/2021 | Tyagi et al. | |
| 2021/0399173 | A1* | 12/2021 | Choi | H10H 20/824 |
| 2022/0223755 | A1 | 7/2022 | Lin et al. | |
| 2022/0352254 | A1 | 11/2022 | Tyagi et al. | |
| 2023/0121340 | A1* | 4/2023 | Dai | H01S 5/18383 372/46.01 |

FOREIGN PATENT DOCUMENTS

| | | | | | |
|---|---|---|---|---|---|
| CN | 112005387 | | | 11/2020 | |
| CN | 108369974 | | | 5/2021 | |
| CN | 115039239 | | | 9/2022 | |
| CN | 115425519 | | | 12/2022 | |
| CN | 115425519 | A | * | 12/2022 | H01S 5/18397 |
| CN | 115986562 | A | * | 4/2023 | |
| TW | 202316758 | | | 4/2023 | |
| WO | WO-2022214249 | A1 | * | 10/2022 | H01S 5/18311 |

* cited by examiner

LIGHT EMITTING DEVICE HAVING ONE CURRENT LIMITING LAYER WITH HIGHER ALUMINUM CONTENT THAN ANOTHER CURRENT LIMITING LAYER

CROSS-REFERENCE TO RELATED APPLICATION

This application claims the priority benefit of Taiwan application serial no. 112116396, filed on May 3, 2023. The entirety of the above-mentioned patent application is hereby incorporated by reference herein and made a part of this specification.

BACKGROUND OF THE INVENTION

Field of the Invention

The invention relates to a photoelectric element, and in particular to a light emitting device.

Description of Related Art

Due to the increasing demand for high-resolution displays, the size of micro light-emitting elements serving as display pixels is continuously shrinking. The shrinkage of the device size increases the ratio of the perimeter of the device to the light emitting area, resulting in a significant decrease in the luminous efficiency of the light emitting device due to the non-radiative recombination caused by the defects generated at the sidewall surface thereof during the etching process, i.e., the size effect (micro-LED size effect). In view of this, a light emitting device structure that may balance size reduction and luminous efficiency remains to be developed.

SUMMARY OF THE INVENTION

The invention provides a light emitting device having better luminous efficiency.

A light emitting device of the invention includes an active layer, a first semiconductor layer, a first contact layer, and a first current limiting layer. The first semiconductor layer is disposed at a first side of the active layer. The first contact layer is disposed at a side of the first semiconductor layer away from the active layer. The first current limiting layer is disposed between the first contact layer and the active layer, and is provided with a first non-oxidizing region and a first oxidizing region located around the first non-oxidizing region. The first current limiting layer has a first surface facing the active layer and a second surface away from the first surface. The first oxidizing region is extended from the first surface to the second surface, and an oxygen content of the first oxidizing region is greater than an oxygen content of the first non-oxidizing region.

Based on the above, in the light emitting device of an embodiment of the invention, the first current limiting layer is provided between the active layer and the first contact layer. Since the oxygen content of the first current limiting layer in the surrounding first oxidizing region is higher than the oxygen content of the first non-oxidizing region away from the surrounding, the current path may be limited to a region farther away from the sidewall of the device. Furthermore, the phenomenon of non-radiative recombination caused by the diffusion of carriers to the sidewall of the device is suppressed, thus helping to improve the luminous efficiency of the light emitting device.

DESCRIPTION OF THE EMBODIMENTS

Figure 1:
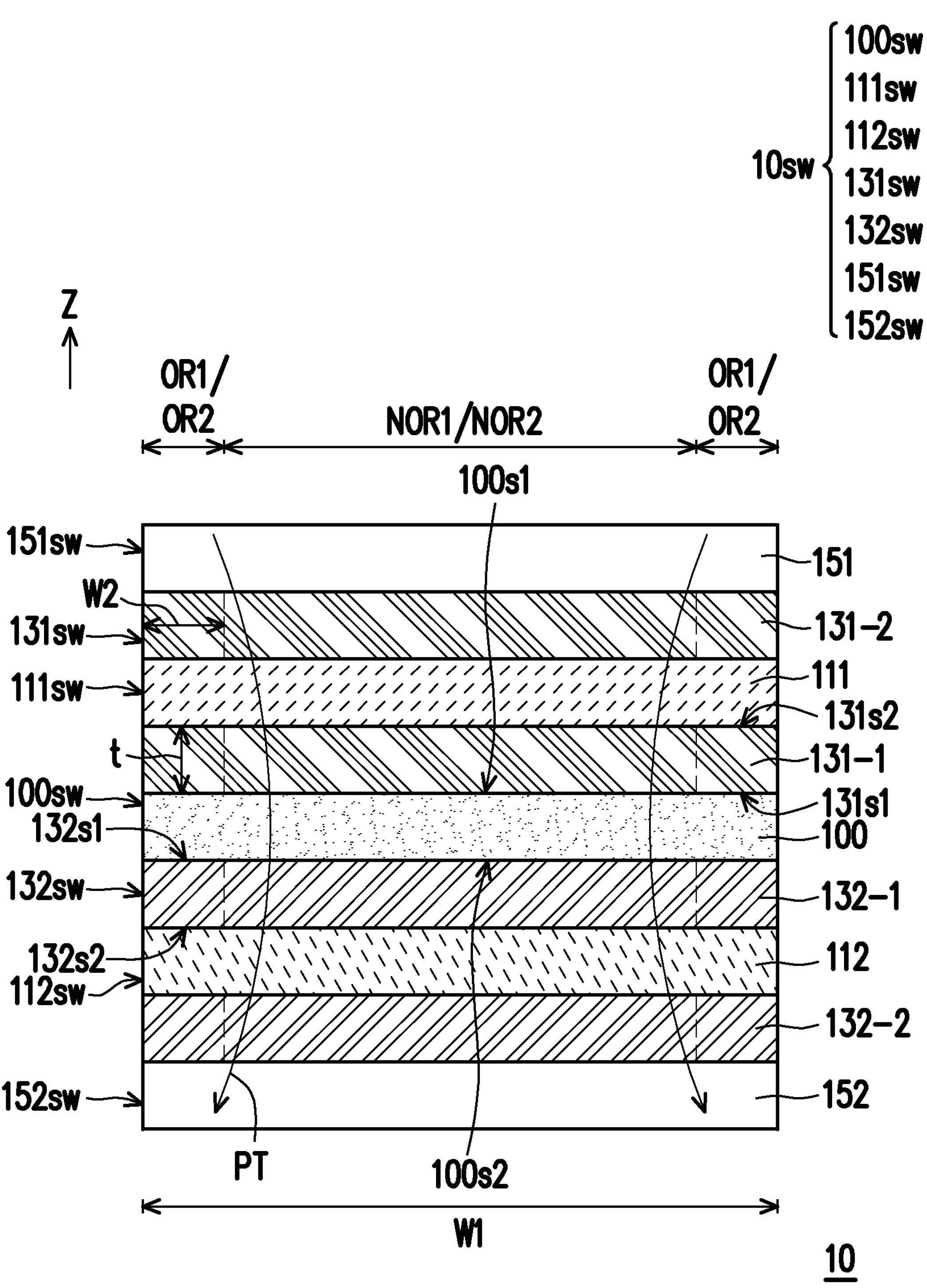
FIG. 1 is a schematic cross-sectional view of a light emitting device according to the first embodiment of the invention.

As used herein, "about", "approximately", "essentially", or "substantially" includes the stated value and the average within an acceptable deviation range for the particular value as determined by one of ordinary skill in the art, taking into account the measurements in question and the specific amount of error associated with the measurements (i.e., limitations of the measurement system). For example, "about" may mean within one or a plurality of standard deviations of the stated value, or for example within ±30%, ±20%, ±15%, ±10%, ±5%. Furthermore, "about", "approximately", "essentially", or "substantially" used herein may adopt a more acceptable deviation range or standard deviation according to the nature of measurement, cutting, or other properties, instead of one standard deviation applied to all properties.

In the figures, for clarity, the thicknesses of, for example, layers, films, panels, and regions are enlarged. It should be understood that when a device such as a layer, film, region, or substrate is referred to as being "on" or "connected to" another device, it may be directly on or connected to the other device, or an intermediate device may also be present. On the other hand, when a device is "directly on another device" or "directly connected to" another device, an intermediate device is not present. As used in the present specification, "connected to" may refer to a physical and/or electrical connection. Furthermore, "electrically connected" may mean that other devices are present between two devices.

In addition, relative terms such as "lower" or "bottom" and "upper" or "top" may be used herein to describe the relationship of one component to another component as shown in the figures. It should be understood that relative terms are intended to include different orientations of the apparatus in addition to the orientation shown. For example, if the apparatus in one of the figures is turned over, devices described as being on the "lower" side of other devices would then be oriented on "upper" sides of the other devices. Thus, the exemplary term "lower" may include both an orientation of "lower" and "upper," depending on the particular orientation of the drawing. Similarly, if the apparatus in one figure is turned over, a device described as "below" other devices or a device "below" is oriented "above" the other devices. Thus, the exemplary term "over" or "under" may include the orientations of above and below.

Exemplary embodiments are described herein with reference to cross section illustrations that are schematic diagrams of idealized embodiments. As such, variations in the shapes of the illustrations as a result, for example, of manufacturing techniques and/or tolerances are to be expected. Thus, embodiments described herein should not be construed as limited to the particular shapes of regions as illustrated herein but are to include deviations in shapes that result, for example, from manufacturing. For example, a region shown or described as flat, may, typically, have rough and/or non-linear features.

Additionally, acute corners shown may be rounded. Thus, the regions shown in the figures are schematic in nature and their shapes are not intended to illustrate the precise shapes of the regions and are not intended to limit the scope of the claims.

Reference will now be made in detail to the exemplary embodiments of the invention, examples of which are illustrated in the accompanying drawings. Wherever possible, the same reference numerals are used in the figures and the descriptions to refer to the same or similar portions.

Figure 2:
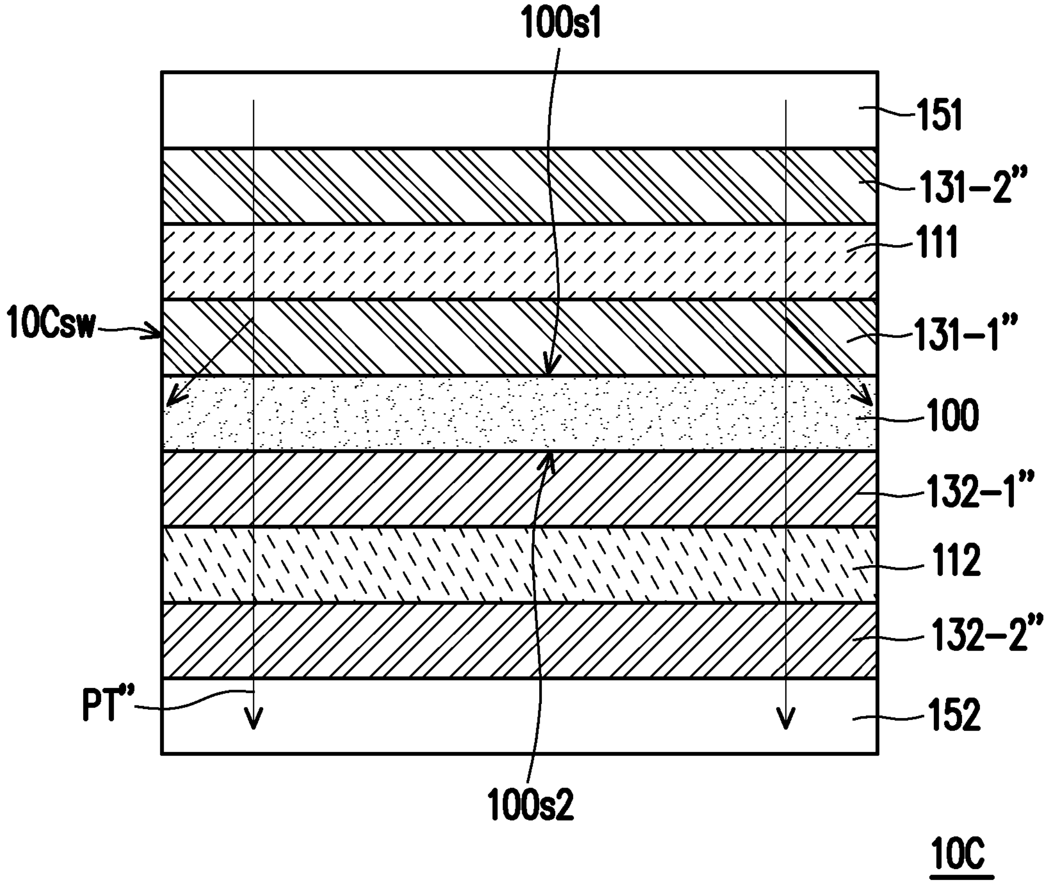
FIG. 2 is a schematic cross-sectional view of a light emitting device of a comparative example.
Figure 3A:
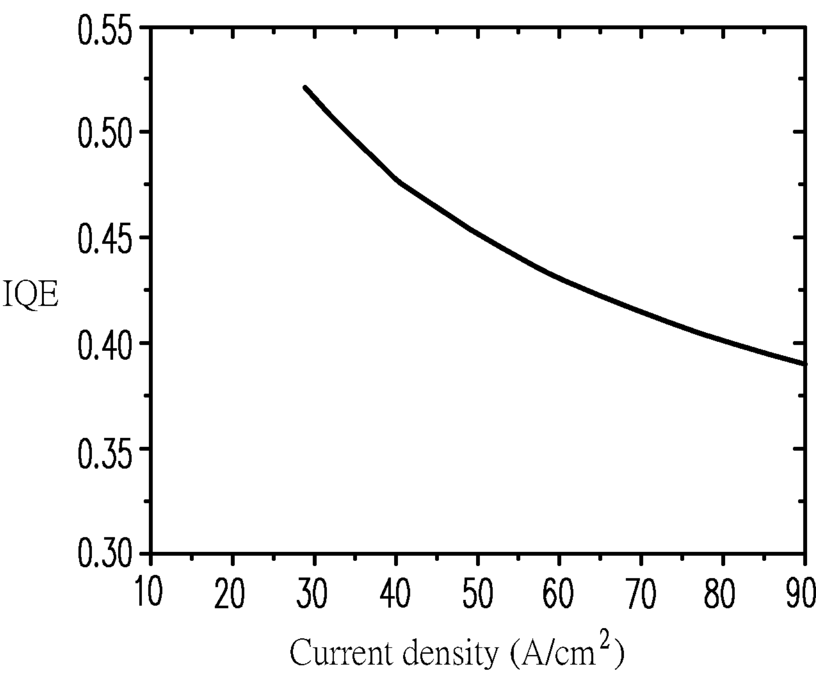
FIG. 3A is a distribution diagram of internal quantum efficiency versus current density of the light emitting device of FIG. 1.
Figure 3B:
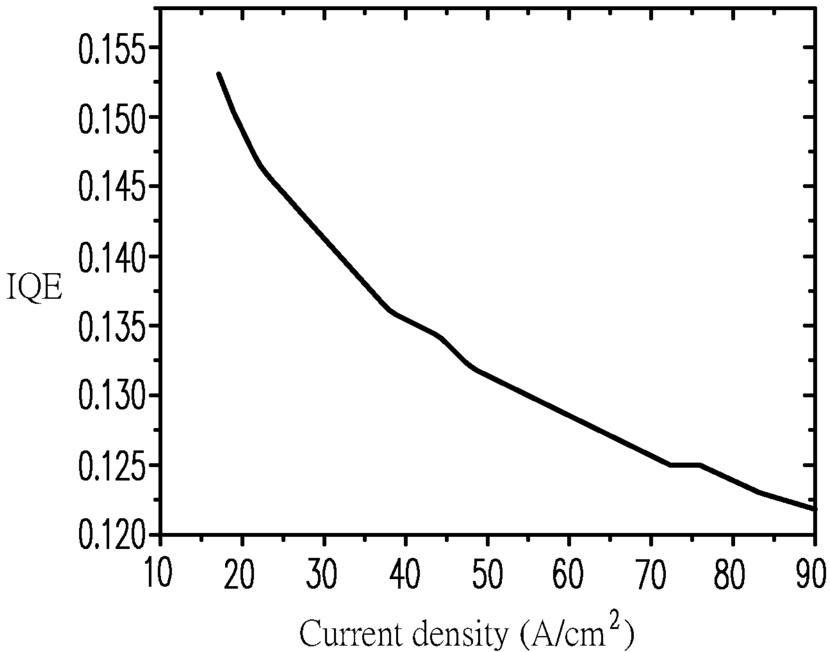
FIG. 3B is a distribution diagram of internal quantum efficiency versus current density of the light emitting device of FIG. 2.
Figure 4A:
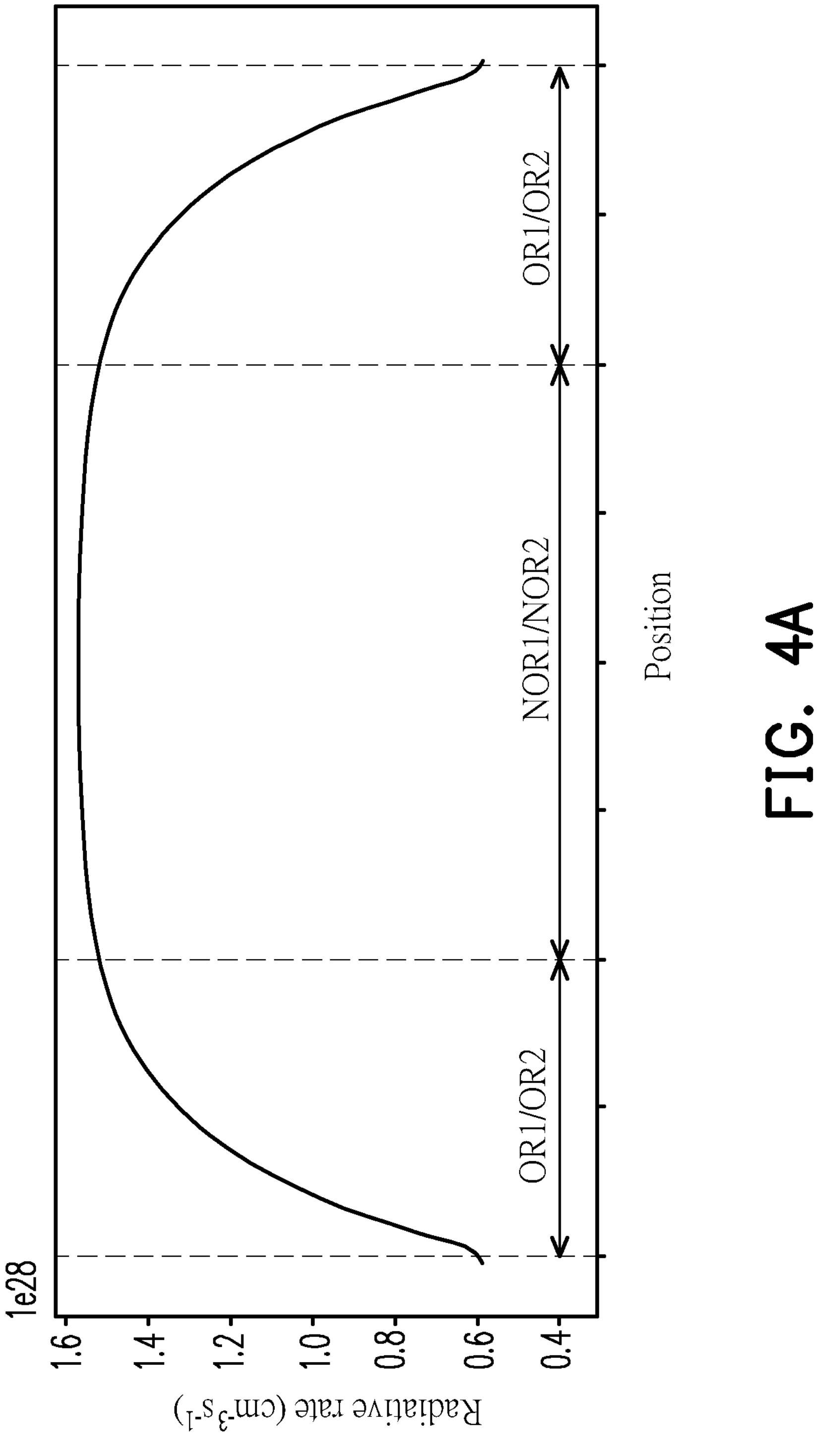
FIG. 4A is a distribution diagram of radiative rate versus position of the light emitting device of FIG. 1.
Figure 4B:
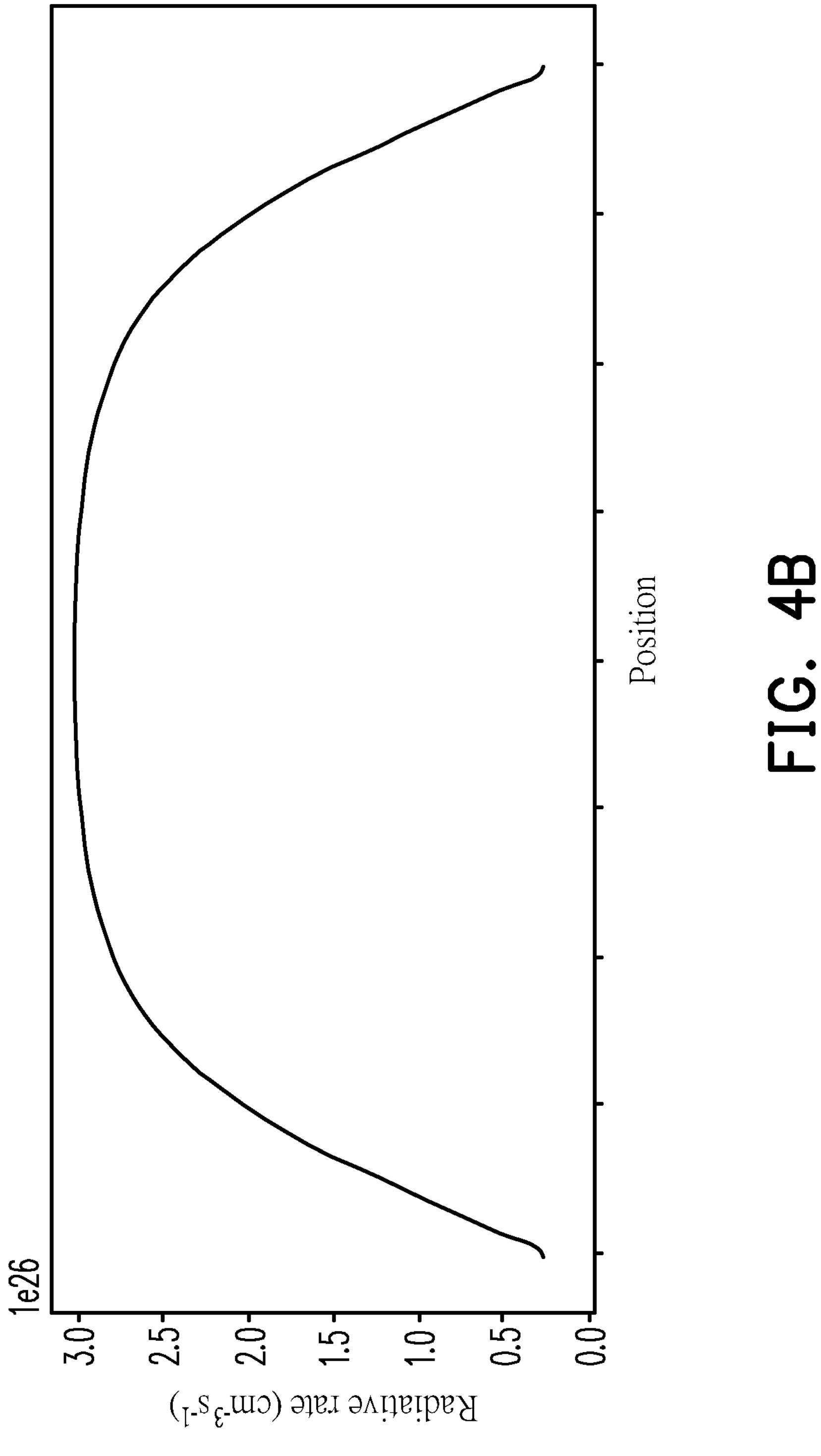
FIG. 4B is a distribution diagram of radiative rate versus position of the light emitting device of FIG. 2.

FIG. 1 is a schematic cross-sectional view of a light emitting device according to the first embodiment of the invention. FIG. 2 is a schematic cross-sectional view of a light emitting device of a comparative example. FIG. 3A is a distribution diagram of internal quantum efficiency versus current density of the light emitting device of FIG. 1. FIG. 3B is a distribution diagram of internal quantum efficiency versus current density of the light emitting device of FIG. 2. FIG. 4A is a distribution diagram of radiative rate versus position of the light emitting device of FIG. 1. FIG. 4B is a distribution diagram of radiative rate versus position of the light emitting device of FIG. 2.

Referring to FIG. 1, a light emitting device 10 includes an active layer 100, a first semiconductor layer 111, a second semiconductor layer 112, a first contact layer 151, and a second contact layer 152. The active layer 100 has a first side **100*s*1 and a second side 100*s*2 away from each other. The first semiconductor layer 111 is disposed at the first side 100*s*1 of the active layer 100. The second semiconductor layer 112 is disposed at the second side 100*s*2 of the active layer 100. The first contact layer 151 is disposed at a side of the first semiconductor layer 111 away from the active layer 100. The second contact layer 152 is disposed at a side of the second semiconductor layer 112 away from the active layer 100**.

More specifically, the light emitting device 10 may be an epitaxial structure including the second contact layer 152, the second semiconductor layer 112, the active layer 100, the first semiconductor layer 111, and the first contact layer 151 sequentially stacked along a direction Z.

In the present embodiment, the light emitting device 10 is, for example, a red micro light emitting diode (micro-LED). The material of the active layer 100 as the light emitting layer is, for example, AlGaInP. The first semiconductor layer 111 is, for example, a p-type semiconductor layer, and the material thereof is, for example, p-AlGaInP. The second semiconductor layer 112 is, for example, an n-type semiconductor layer, and the material thereof is, for example, n-AlGaInP. The first contact layer 151 is, for example, a p-type contact layer, and the material thereof is, for example, p-GaAs. The second contact layer 152 is, for example, an n-type contact layer, and the material thereof is, for example, n-GaAs. Although not shown in FIG. 1, the light emitting device 10 may also include an n-type electrode and a p-type electrode, wherein the n-type electrode is disposed at the side of the light emitting device 10 where the n-type contact layer is provided, and the p-type electrode is disposed at the side of the light emitting device 10 where the p-type contact layer is provided, but not limited thereto.

However, the invention is not limited thereto. In other embodiments, the material of the active layer 100 may be InGaN, GaN, or AlGaN, the material of the semiconductor layer may be AlGaN, and the material of the contact layer may be GaP or GaN. The first semiconductor layer 111 may be an n-type semiconductor layer. The second semiconductor layer 112 may be a p-type semiconductor layer. The first contact layer 151 may be an n-type contact layer. The second contact layer 152 may be a p-type contact layer.

In the present embodiment, in order to increase the luminous efficiency (that is, the efficiency of radiative recombination), the light emitting device 10 further includes a plurality of current limiting layers. These current limiting layers are, for example, a first current limiting layer 131-1, a first current limiting layer 131-2, a second current limiting layer 132-1, and a second current limiting layer 132-2, but not limited thereto. In detail, the first current limiting layer 131-1 is disposed between the first semiconductor layer 111 and the active layer 100. The first current limiting layer 131-2 is disposed between the first semiconductor layer 111 and the first contact layer 151. The second current limiting layer 132-1 is disposed between the second semiconductor layer 112 and the active layer 100. The second current limiting layer 132-2 is disposed between the second semiconductor layer 112 and the second contact layer 152. Preferably, a film thickness t of each of these current limiting layers along the stacking direction (for example, the direction Z) may be in the range of 30 nm to 50 nm.

It should be noted that, the first current limiting layer 131-1 and the first current limiting layer 131-2 are each provided with a first non-oxidizing region NOR1 and a first oxidizing region OR1 located around the first non-oxidizing region NOR1, and the second current limiting layer 132-1 and the second current limiting layer 132-2 are each provided with a second non-oxidizing region NOR2 and a second oxidizing region OR2 located around the second non-oxidizing region NOR2. In the present embodiment, the material of the current limiting layer is, for example, $Al_{(x)}In_{(1-x)}P$, wherein 1≥x>0, and the oxygen content of the oxidizing region is greater than the oxygen region of the non-oxidizing region. More specifically, the material composition of the current limiting layer in the non-oxidizing region is $Al_{(x)}In_{(1-x)}P$, and the material composition thereof in the oxidizing region is $Al_{(y)}In_{(z)}O_{(1-y-z)}P$, wherein 1>y>0, and 1>z>0. Preferably, the oxygen content ratio of the current limiting layer in the oxidizing region may be greater than 10%. However, the invention is not limited thereto. In other embodiments, the material composition of the current limiting layer in the non-oxidizing region may be $Al_{(x)}Ga_{(1-x)}As$, and the material composition thereof in the oxidizing region may be $Al_{(y)}Ga_{(z)}O_{(1-y-z)}As$, wherein 1≥x>0, 1>y>0, and 1>z>0.

In the present embodiment, the first current limiting layer is, for example, a p-type current limiting layer, and the concentration of the p-type dopant (for example: aluminum (Al), boron (B), or gallium (Ga)) thereof is preferably in the range of $10^{18}$ atoms/$cm^3$ to $10^{20}$ atoms/$cm^3$. The second current limiting layer is, for example, an n-type current limiting layer, and the concentration of the n-type dopant (for example: arsenic (As), phosphorus (P), or antimony (Ti)) thereof is preferably in the range of $10^{18}$ atoms/$cm^3$ to $10^{20}$ atoms/$cm^3$. However, the invention is not limited thereto. In another embodiment, if the first semiconductor layer is an n-type semiconductor layer and the first contact layer is an n-type contact layer, the first current limiting layer may be an n-type current limiting layer; similarly, if the second semiconductor layer is a p-type semiconductor layer and the second contact layer is a p-type contact layer, the second current limiting layer may be a p-type current limiting layer. In another embodiment, the material of the current limiting layer is, for example, GaN, the p-type dopant of the p-type current limiting layer may be magnesium (Mg), and the n-type dopant of the n-type current limiting layer may be silicon (Si).

Moreover, the first current limiting layer has a surface 131*s*1 (i.e., the first surface) facing the active layer 100 and another surface 131*s*2 (i.e., the second surface) away from the surface 131*s*1, and the first oxidizing region OR1 is extended from the surface 131*s*1 to the surface 131*s*2. Similarly, the second current limiting layer has a surface 132*s*1 (i.e., the third surface) facing the active layer 100 and another surface 132*s*2 (i.e., the fourth surface) away from the surface 132*s*1, and the second oxidizing region OR2 is extended from the surface 132*s*1 to the surface 132*s*2. That is, the oxidizing region of the current limiting layer penetrates the current limiting layer along the direction Z.

In the present embodiment, a sidewall 100*sw* of the active layer 100, a sidewall 111*sw* of the first semiconductor layer 111, a sidewall 112*sw* of the second semiconductor layer 112, a sidewall 151*sw* of the first contact layer 151, a sidewall 152*sw* of the second contact layer 152, a sidewall 131*sw* of each of the first current limiting layer 131-1 and the first current limiting layer 131-2, and a sidewall 132*sw* of each of the second current limiting layer 132-1 and the second current limiting layer 132-2 may be aligned with each other along the stacking direction (i.e., the direction Z) of the layers and form a sidewall 10*sw* of the light emitting device 10.

It should be noted that the oxidizing region of the current limiting layer is extended from the sidewall (such as the sidewall 131*sw* or the sidewall 132*sw*) of the current limiting layer toward the non-oxidizing region to a depth from the sidewall. More specifically, each of the current limiting layers has a first width W1 along the normal direction of the sidewall 10*sw*, the first oxidizing region OR1 of the first current limiting layer and the second oxidizing region OR2 of the second current limiting layer each have a second width W2 along the normal direction of the sidewall 10*sw*, and the ratio of the second width W2 to the first width W1 is preferably in a range of 0.01 to 0.3. In the present embodiment, the widths of the oxidizing regions of the current limiting layers along the normal direction of the sidewall 10*sw* may be substantially the same, but not limited thereto.

From another perspective, since the sidewalls of the current limiting layer, the active layer 100, and the semiconductor layer are aligned with each other along the stacking direction thereof, the oxidizing region of the current limiting layer is overlapped with a portion of the active layer 100 along the stacking direction.

The resistivity of each of the first current limiting layer 131-1 and the first current limiting layer 131-2 in the first oxidizing region OR1 is greater than the resistivity thereof in the first non-oxidizing region NOR1. The resistivity of each of the second current limiting layer 132-1 and the second current limiting layer 132-2 in the second oxidizing region OR2 is greater than the resistivity thereof in the second non-oxidizing region NOR2. Preferably, the resistivity of the current limiting layer in the oxidizing region is greater than $10^{14}$ Ω·cm.

Since the resistivity of each of the first current limiting layer 131-1, the first current limiting layer 131-2, the second current limiting layer 132-1, and the second current limiting layer 132-2 in the oxidizing region is greater than the resistivity thereof in the non-oxidizing region, the moving path (that is, a current path PT) of carriers is confined in the non-oxidizing regions (as shown in FIG. 1) of these current limiting layers when passing through the first semiconductor layer 111, the active layer 100, and the second semiconductor layer 112, thus suppressing the phenomenon of non-radiative recombination caused by the diffusion of carriers to the sidewall 10*sw* of the light emitting device 10. Accordingly, the luminous efficiency of the light emitting device may be effectively improved.

Please refer to FIG. 1 and FIG. 2, in the comparative example shown in FIG. 2, in a light emitting device 10C, a first cladding layer 131-1", a first cladding layer 131-2", a second cladding layer 132-1", and a second cladding layer 132-2" respectively replace the first current limiting layer 131-1, the first current limiting layer 131-2, the second current limiting layer 132-1, and the second current limiting layer 132-2 of the light emitting device 10 of the present embodiment. For example, in the comparative example, the material of these cladding layers is $Al_{(x)}In_{(1-x)}P$, for example, wherein $1 \geq x > 0$.

From another point of view, the current limiting layer of the present embodiment is, for example, formed by selective wet oxidation of the cladding layer in the comparative example. More specifically, the light emitting device 10 of the present embodiment may be obtained by performing selective wet oxidation on a sidewall 10Csw of the light emitting device 10C of the comparative example. In the present embodiment, since phosphorus atoms (P) are more readily replaced by oxygen atoms (O) than aluminum atoms (Al) and indium atoms (In), after selective wet oxidation, the cladding layer (current limiting layer) is mainly composed of $Al_2O_3$ and $In_2O_3$ in the oxidizing region, and therefore has a higher resistivity.

The higher the aluminum content of the cladding layer, the more efficient the selective wet oxidation. However, considering the lattice matching between the cladding layer and other epitaxial layers (such as semiconductor layers or contact layers) or the substrate (not shown), the ratio x of the aluminum content may preferably be controlled in a range of less than or equal to 0.69.

Since the cladding layer of the light emitting device 10C of the comparative example is not subjected to selective wet oxidation, the resistivity thereof near the sidewall is equivalent to the resistivity away from the sidewall. Therefore, there is no limiting effect on a current path PT" (as shown in FIG. 2), so that some carriers are readily diffused to the sidewall 10Csw for non-radiative recombination, resulting in a decrease in the luminous efficiency of the light emitting device 10C of the comparative example.

From the comparison of FIG. 3A and FIG. 3B, it may be seen that under the condition of current density of 90 $A/cm^2$, the internal quantum efficiency (IQE) of the light emitting device 10 of the present embodiment (as shown in FIG. 3A) is about four times the IQE of the light emitting device 10C of the comparative example (as shown in FIG. 3B).

Similarly, the radiative rate of the light emitting device 10 of the present embodiment (as shown in FIG. 4A) is about one hundred times (that is, the difference of two orders of magnitude) that of the light emitting device 10C of the comparative example (as shown in FIG. 4B). For example, the maximum radiative rate of the light emitting device 10 of the present embodiment is about $1.6\times10^{28}$ $cm^{-3}s^{-1}$, and the maximum radiative rate of the light emitting device 10C of the comparative example is about $3.0\times10^{26}$ $cm^{-3}s^{-1}$.

It may be known from the above results that, the oxidizing region (that is, the oxidizing region of the current limiting layer of the present embodiment) of the cladding layer formed near the sidewall after selective wet oxidation may indeed confine the current path in the non-oxidizing region away from the sidewall, thus significantly reducing the opportunity of non-radiative recombination caused by the diffusion of carriers to the sidewall of the device, thereby significantly improving the luminous efficiency of the light emitting device 10.

Some other embodiments will be enumerated below to describe the invention in detail, wherein the same components are marked with the same reference numerals, and descriptions of the same technical content is omitted. For the omitted parts, please refer to the above embodiments, which are not be repeated herein.

Figure 5:
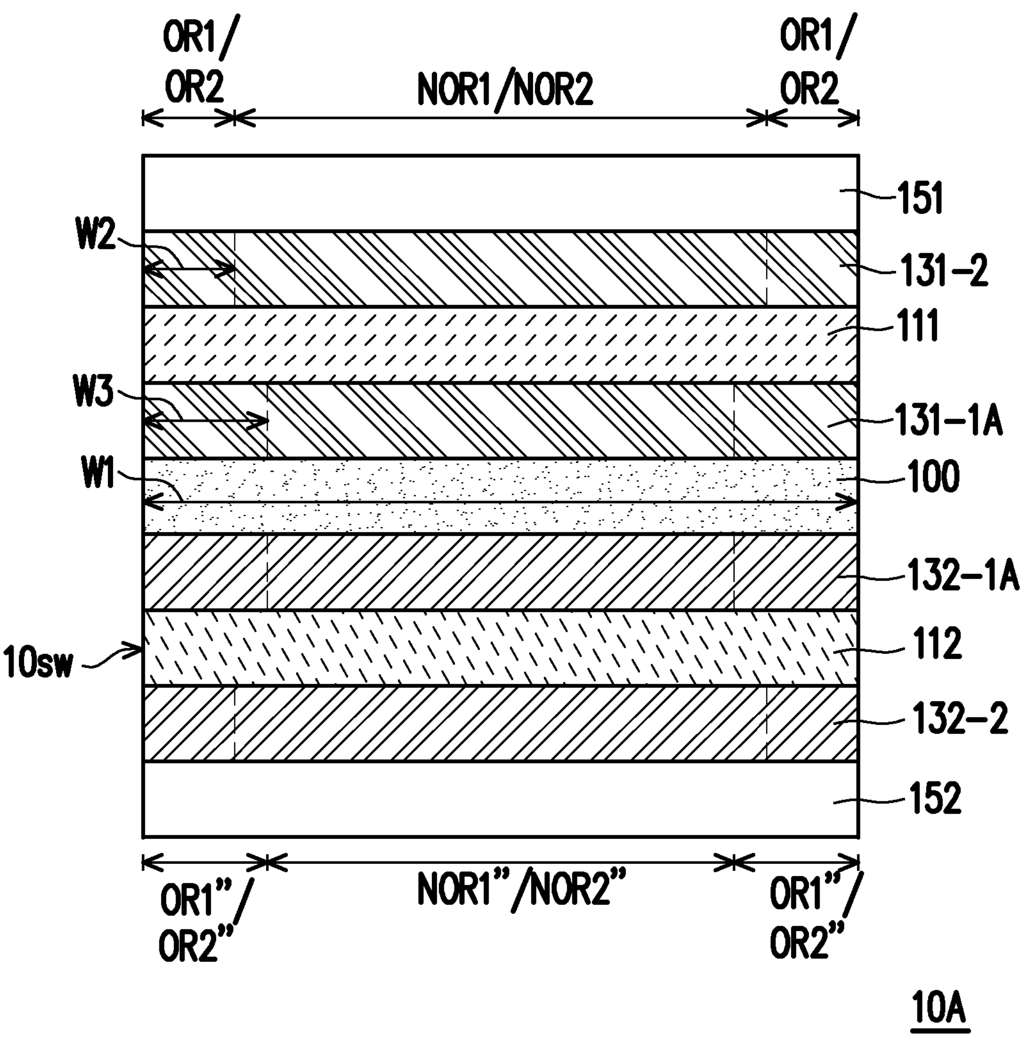
FIG. 5 is a schematic cross-sectional view of a light emitting device according to the second embodiment of the invention.

FIG. 5 is a schematic cross-sectional view of a light emitting device according to the second embodiment of the invention. Referring to FIG. 5, the difference between a light emitting device 10A of the present embodiment and the light emitting device 10 of FIG. 1 is that the current limiting layer of the present embodiment may have different widths of the oxidizing region. For example, in the present embodiment, a first the oxidizing region OR1" of a first current limiting layer 131-1A located between the active layer 100 and the first semiconductor layer 111 (or a second current limiting layer 132-1A located between the active layer 100 and the second semiconductor layer 112) has a third width W3 along the normal direction of the sidewall thereof, and the third width W3 is greater than the second width W2 of the second oxidizing region OR2 of the first current limiting layer 131-2 located between the first semiconductor layer 111 and the first contact layer 151 (or the second current limiting layer 132-2 located between the second semiconductor layer 112 and the second contact layer 152).

In other words, the depth of the first oxidizing region OR1" of the first current limiting layer 131-1A closer to the active layer 100 extended from the sidewall 10*sw* of the light emitting device 10A is greater than the depth of the first oxidizing region OR1 of the first current limiting layer 131-2 farther away from the active layer 100 extended from the sidewall 10*sw*, and the depth of the second oxidizing region OR2" of the second current limiting layer 132-1A closer to the active layer 100 extended from the sidewall 10*sw* is greater than the depth of the second oxidizing region OR2 of the second current limiting layer 132-2 farther away from the active layer 100 extended from the sidewall 10*sw*. Accordingly, the current path is limited to the non-oxidizing region (such as a first non-oxidizing region NOR1" and a second non-oxidizing region NOR2") farther away from the sidewall 10*sw* as the active layer 100 is approached, thus helping to further improve the luminous efficiency of the light emitting device 10A.

In particular, the depth of the oxidizing region of the current limiting layer may be controlled by its own aluminum content, for example: under the same selective wet oxidation process conditions, for the cladding layer with higher aluminum content (as shown in FIG. 2), the depth of the oxidizing region of the current limiting layer formed is larger; on the contrary, for the cladding layer with lower aluminum content, the depth of the oxidizing region of the current limiting layer formed is a smaller.

Figure 6:
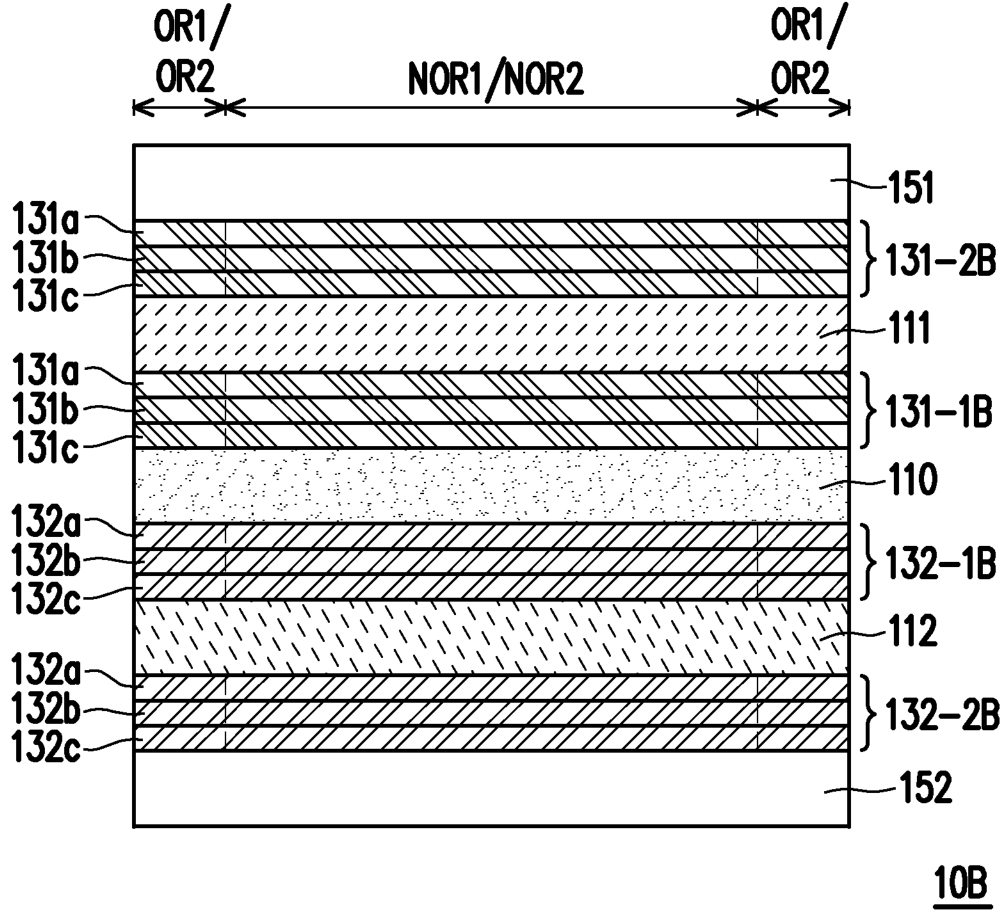
FIG. 6 is a schematic cross-sectional view of a light emitting device according to the third embodiment of the invention.

FIG. 6 is a schematic cross-sectional view of a light emitting device according to the third embodiment of the invention. Referring to FIG. 6, the difference between a light emitting device 10B of the present embodiment and the light emitting device 10 of FIG. 1 is that the structure of the current limiting layer is different. Specifically, in the present embodiment, the current limiting layer of the light emitting device 10B may be a multilayer stack structure.

For example, in the present embodiment, each of a first current limiting layer 131-1B and a first current limiting layer 131-2B may include a first sublayer 131*a*, a second sublayer 131*b*, and a third sublayer 131*c*, and each of the second current limiting layer 132-1B and the second current limiting layer 132-2B may include a first sublayer 132*a*, a second sublayer 132*b*, and a third sublayer 132*c*. In particular, the second sublayer 131*b* of the first current limiting layer is interposed between the first sublayer 131*a* and the third sublayer 131*c*, and the second sublayer 132*b* of the second current limiting layer is interposed between the first sublayer 132*a* and the third sublayer 132*c*. In the present embodiment, the material of the first sublayer 131*a*, the third sublayer 131*c*, the first sublayer 132*a*, and the third sublayer 132*c* is, for example, AlInP, and the material of the second sublayer 131*b* and the second sublayer 132*b* is, for example, AlGaAs, but not limited thereto.

Figure 7:
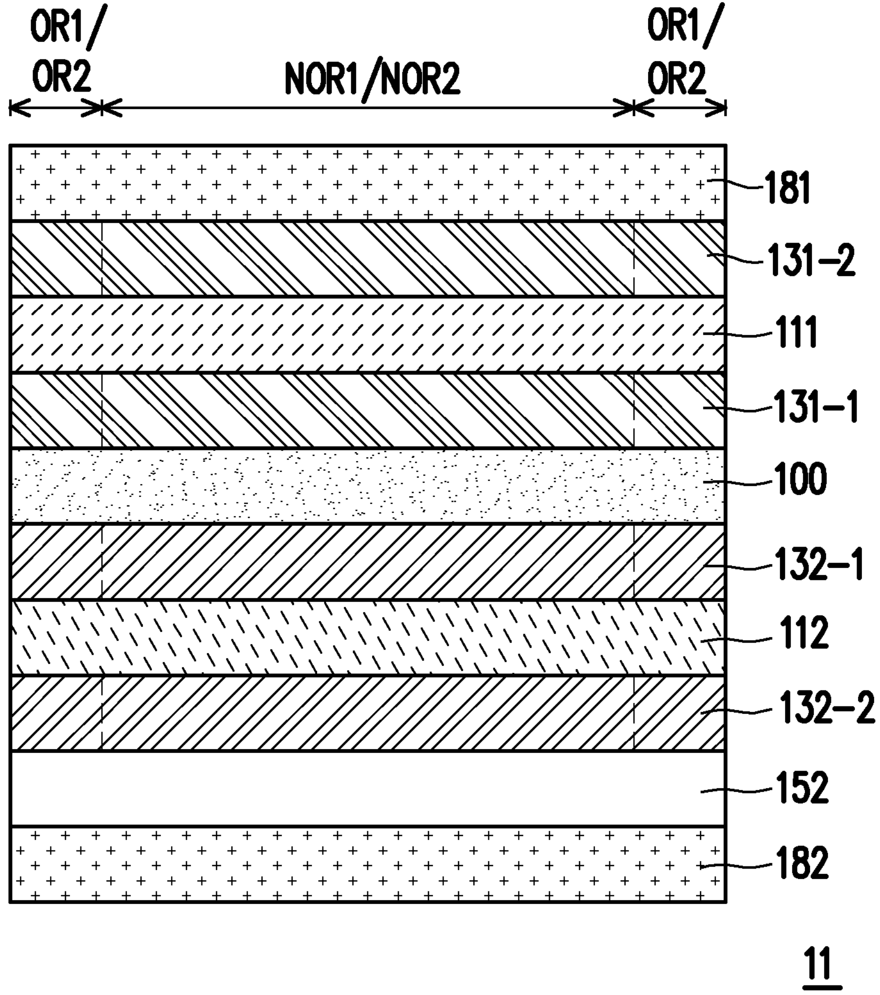
FIG. 7 is a schematic cross-sectional view of a light emitting device according to the fourth embodiment of the invention.

FIG. 7 is a schematic cross-sectional view of a light emitting device according to the fourth embodiment of the invention. Please refer to FIG. 7, different from the light emitting device 10 of FIG. 1, in the present embodiment, a light emitting device 11 may further include two distributed Bragg reflectors (DBR), such as a first DBR 181 and a second DBR 182, so as to improve the light extraction efficiency of the light emitting device 11. In the present embodiment, the first DBR 181 is, for example, a p-type DBR, and is disposed at a side of the first semiconductor layer 111 away from the active layer 100. The second DBR 182 is, for example, an n-type DBR, and is disposed at a side of the second semiconductor layer 112 away from the active layer 100.

More specifically, in the present embodiment, the first DBR 181 may be disposed at a side of the first current limiting layer 131-2 away from the first semiconductor layer 111, and the second DBR 182 may be disposed at a side of the second contact layer 152 away from the second semiconductor layer 112, but not limited thereto. In other embodiments not shown, the second DBR 182 may be disposed between the second contact layer 152 and the second current limiting layer 132-2, or the first DBR 181 may be disposed between the first contact layer 151 as shown in FIG. 1 and the first current limiting layer 131-2.

For example, a DBR is a reflective layer formed by repeatedly laminating a low-refractive layer (not shown) and a high-refractive layer (not shown), and the film thickness of each of the low refractive index layer and the high refractive index layer may be appropriately determined according to the refractive index and the emission wavelength of each of the layers. The low refractive index layer and the high refractive index layer are made of, for example, two materials with the same composition as the above semiconductor layer or contact layer but with different proportions, but not limited thereto. It should be noted that, although not shown in the drawings, the DBR of the present embodiment may also be applied to the light emitting device of any of the above embodiments.

Figure 8:
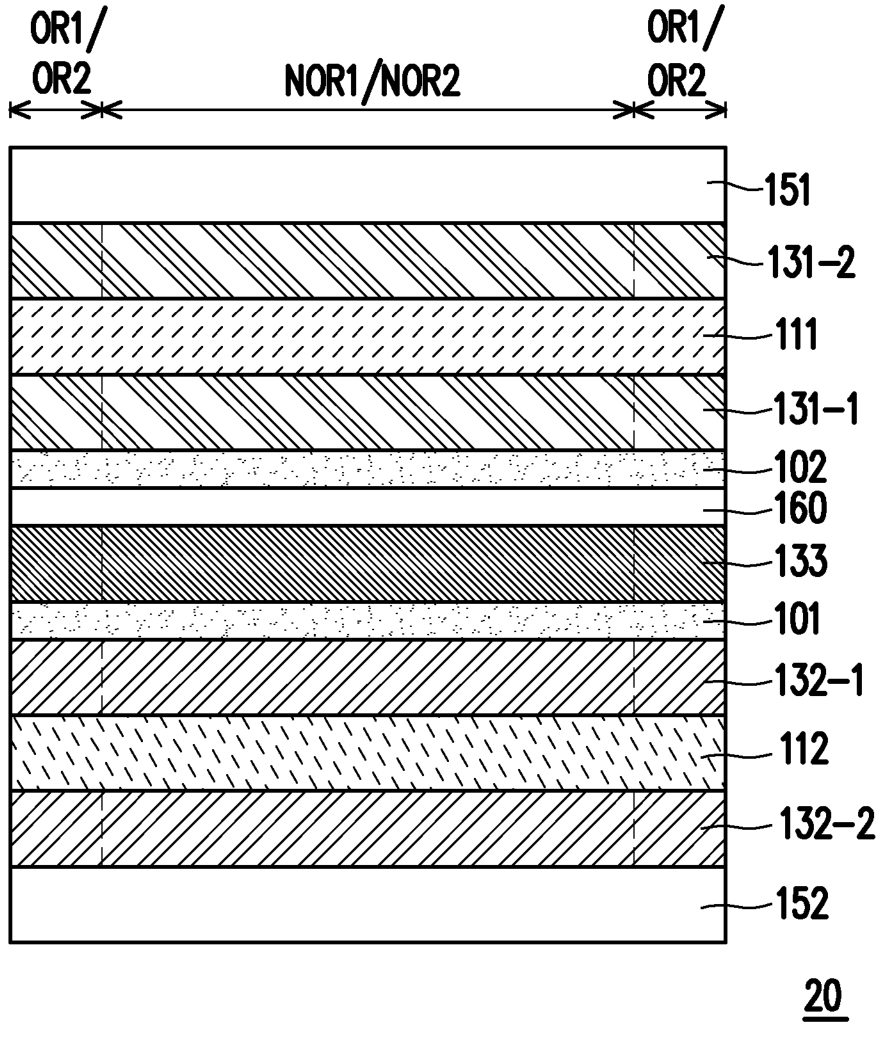
FIG. 8 is a schematic cross-sectional view of a light emitting device according to the fifth embodiment of the invention.

FIG. 8 is a schematic cross-sectional view of a light emitting device according to the fifth embodiment of the invention. Please refer to FIG. 8, different from the light emitting device 10 of FIG. 1, in the present embodiment, the number of active layers of a light emitting device 20 is two, namely the active layer 101 and the active layer 102. The two active layers are disposed between the first current limiting layer 131-1 and the second current limiting layer 132-1. In order to increase the luminous efficiency, a tunnel junction layer 160 and another current limiting layer 133 may be provided between the active layer 101 and the active layer 102 of the light emitting device 20.

Since the structure of the current limiting layer 133 of the present embodiment is similar to that of the second current limiting layer or the first current limiting layer of the above embodiments, please refer to the relevant paragraphs of the above embodiments for details, which are not repeated herein. In particular, the first DBR 181 and the second DBR 182 of FIG. 7 may also be applied in the light emitting device 20 of the present embodiment, so as to further improve the luminous efficiency.

Based on the above, in the light emitting device of an embodiment of the invention, the first current limiting layer is provided between the active layer and the first contact layer. Since the oxygen content of the first current limiting layer in the surrounding first oxidizing region is higher than the oxygen content of the first non-oxidizing region away from the surrounding, the current path may be limited to a region farther away from the sidewall of the device. Furthermore, the phenomenon of non-radiative recombination caused by the diffusion of carriers to the sidewall of the device is suppressed, thus helping to improve the luminous efficiency of the light emitting device.

What is claimed is:

1. A light emitting device, comprising:
an active layer;
a first semiconductor layer disposed at a first side of the active layer;
a first contact layer disposed at a side of the first semiconductor layer away from the active layer;
a first current limiting layer disposed between the first contact layer and the active layer and provided with a first non-oxidizing region and a first oxidizing region located around the first non-oxidizing region, and the first current limiting layer has a first surface facing the active layer and a second surface away from the first surface, wherein the first oxidizing region of the first current limiting layer is extended from the first surface to the second surface, an oxygen content of the first oxidizing region is greater than an oxygen content of the first non-oxidizing region, and the first current limiting layer is disposed between the active layer and the first semiconductor layer; and
another first current limiting layer disposed between the first contact layer and the first semiconductor layer, wherein an aluminum content of the first current limiting layer is higher than an aluminum content of the another first current limiting layer.

2. The light emitting device of claim 1, wherein a material of the first current limiting layer and the another first current limiting layer comprises $Al_{(x)}In_{(1-x)}P$ or $Al_{(x)}Ga_{(1-x)}As$, wherein $1 \geq x > 0$.

3. The light emitting device of claim 1, wherein the first oxidizing region of the first current limiting layer has a third width along a normal direction of a sidewall of the first current limiting layer, the first oxidizing region of the another first current limiting layer has a second width along a normal direction of a sidewall of the another first current limiting layer, and the third width is greater than the second width.

4. The light emitting device of claim 1, wherein a material composition of the first current limiting layer in the first non-oxidizing region is $Al_{(x)}In_{(1-x)}P$ or $Al_{(x)}Ga_{(1-x)}As$, and a material composition thereof in the first oxidizing region is $Al_{(y)}In_{(z)}O_{(1-y-z)}P$ or $Al_{(y)}Ga_{(z)}O_{(1-y-z)}As$, wherein $1 \geq x > 0$, $1 > y > 0$, and $1 > z > 0$.

5. The light emitting device of claim 1, further comprising:
a second semiconductor layer disposed at a second side of the active layer away from the first side;
a second contact layer disposed at a side of the second semiconductor layer away from the active layer; and
a second current limiting layer disposed between the second contact layer and the active layer and provided with a second non-oxidizing region and a second oxidizing region located around the second non-oxidizing region, and the second current limiting layer has a third surface facing the active layer and a fourth surface away from the third surface, wherein the second oxidizing region of the second current limiting layer is extended from the third surface to the fourth surface, and an oxygen content of the second oxidizing region is greater than an oxygen content of the second non-oxidizing region.

6. The light emitting device of claim 5, wherein another second current limiting layer is disposed between the active layer and the second semiconductor layer.

7. The light emitting device of claim 1, wherein the first oxidizing region and the first non-oxidizing region of the first current limiting layer are arranged along a direction, the first current limiting layer has a first width along the direction, a portion of the first oxidizing region on one side of the first non-oxidizing region has a third width along the direction, and a ratio of the third width to the first width is in a range of 0.01 to 0.3.

8. The light emitting device of claim 1, wherein a film thickness of the first current limiting layer is in a range of 30 nm to 50 nm.

9. The light emitting device of claim 1, further comprising:
another active layer; and
a tunnel junction layer disposed between the active layer and the another active layer and in contact with the active layer or the another active layer.

10. The light emitting device of claim 9, further comprising:
a second current limiting layer disposed between the active layer and the another active layer, the second current limiting layer is provided with a second non-oxidizing region and a second oxidizing region located around the second non-oxidizing region, and the second current limiting layer has a third surface facing the active layer and a fourth surface away from the third surface, wherein the second oxidizing region of the second current limiting layer is extended from the third surface to the fourth surface, and an oxygen content of the second oxidizing region is greater than an oxygen content of the second non-oxidizing region.

11. The light emitting device of claim 1, further comprising:

a distributed Bragg reflector disposed at a side of the first semiconductor layer away from the active layer.

12. The light emitting device of claim 1, wherein the first oxidizing region is overlapped with a portion of the active layer along a stacking direction of the active layer and the first semiconductor layer.

13. The light emitting device of claim 12, wherein respective sidewalls of the active layer, the first semiconductor layer, and the first current limiting layer are aligned with each other along the stacking direction.

14. The light emitting device of claim 1, wherein an oxygen content ratio of the first current limiting layer in the first oxidizing region is greater than 10%.

15. The light emitting device of claim 1, wherein a resistivity of the first current limiting layer in the first oxidizing region is greater than a resistivity thereof in the first non-oxidizing region.

16. The light emitting device of claim 15, wherein the resistivity of the first current limiting layer in the first oxidizing region is greater than $10^{14}$ Ω·cm.

* * * * *